US010553614B2

(12) United States Patent
Zhou

(10) Patent No.: US 10,553,614 B2
(45) Date of Patent: Feb. 4, 2020

(54) THIN-FILM TRANSISTOR ARRAY SUBSTRATE AND MANUFACTURING METHOD FOR THE SAME

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Xingyu Zhou, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/023,702

(22) Filed: Jun. 29, 2018

(65) Prior Publication Data

US 2019/0244980 A1     Aug. 8, 2019

Related U.S. Application Data

(63) Continuation of application No. PCT/CN2018/078339, filed on Mar. 7, 2018.

(30) Foreign Application Priority Data

Feb. 5, 2018 (CN) .......................... 2018 1 0111246

(51) Int. Cl.
*H01L 27/12* (2006.01)
*H01L 29/66* (2006.01)
*H01L 29/786* (2006.01)

(52) U.S. Cl.
CPC ........ *H01L 27/1225* (2013.01); *H01L 27/127* (2013.01); *H01L 27/1255* (2013.01); *H01L 29/66969* (2013.01); *H01L 29/7869* (2013.01)

(58) Field of Classification Search
None
See application file for complete search history.

(56) References Cited

U.S. PATENT DOCUMENTS

| 2008/0284933 | A1* | 11/2008 | Ito ....................... H01L 27/1225 349/43 |
| 2018/0011356 | A1* | 1/2018 | Kong ..................... G02F 1/1368 |
| 2018/0151633 | A1* | 5/2018 | Won ..................... H01L 27/3248 |

FOREIGN PATENT DOCUMENTS

| CN | 1375733 A | 10/2002 |
| CN | 1771595 A | 5/2006 |

(Continued)

OTHER PUBLICATIONS

International search report dated Nov. 8, 2018 from corresponding application No. PCT/CN2018/078339.

*Primary Examiner* — Michelle Mandala
(74) *Attorney, Agent, or Firm* — Leong C. Lei

(57) ABSTRACT

A manufacturing method for a thin-film transistor array substrate is disclosed. The method includes: providing a base substrate; depositing a first metal layer on the base substrate, and patterning to form a gate electrode and a first storage electrode; depositing a gate insulation layer, wherein the gate insulation layer covers the gate electrode and the first storage electrode; depositing a metal oxide semiconductor layer, and patterning to form a metal oxide active layer; depositing a second insulation layer, and patterning to form an etching barrier layer; depositing a second metal layer, and patterning to form a source electrode, a drain electrode and a second storage electrode, wherein the first storage electrode and the second storage electrode are two electrodes of a storage capacitor; depositing a third insulation layer, and patterning to form a passivation layer; and depositing a third metal layer, and patterning to form a pixel electrode.

7 Claims, 6 Drawing Sheets

(56) References Cited

FOREIGN PATENT DOCUMENTS

| CN | 103985713 A | 8/2014 |
|----|-------------|--------|
| CN | 104253158 A | 12/2014 |
| CN | 106992147 A | 7/2017 |
| CN | 107331669 A | 11/2017 |

* cited by examiner

THIN-FILM TRANSISTOR ARRAY SUBSTRATE AND MANUFACTURING METHOD FOR THE SAME

CROSS REFERENCE

This application is a continuing application of PCT Patent Application No. PCT/CN2018/078339, entitled "THIN-FILM TRANSISTOR ARRAY SUBSTRATE AND MANUFACTURING METHOD FOR THE SAME", filed on Mar. 7, 2018, which claims priority to China Patent Application No. CN 201810111246.4 filed on Feb. 5, 2018, both of which are hereby incorporated in its entireties by reference.

FIELD OF THE INVENTION

The present invention relates to a display technology field, and more particularly to a thin-film transistor array substrate and a manufacturing method for the same.

BACKGROUND OF THE INVENTION

In a conventional thin-film transistor array substrate, with reference to FIG. 1, the thin-film transistor array substrate includes: a base substrate 110, a buffering layer 120, a gate electrode 131, a first storage electrode 132, a gate insulation layer 140, a metal oxide active layer 150, an etching barrier layer 160, a source electrode 171, a drain electrode 172, a second storage electrode 173, a passivation layer 180 and a pixel electrode 190. Wherein, the gate insulation layer 140 is provided with a storage through hole corresponding to the first storage electrode 132. The first storage electrode 132, the etching barrier layer 160 and the second storage electrode 173 form a storage capacitor.

In the above structure, forming the gate electrode 131 and the first storage electrode 132 requires one mask. Forming the gate insulation layer 160 requires one mask. Forming the source electrode 171, the drain electrode 172 and the second storage electrode 173 requires one mask. Forming the passivation layer 180 requires one mask. Forming a pixel electrode 190 requires one mask. Accordingly, the entire thin-film transistor array substrate requires 7 masks such that the number of the mask is higher, the cost is higher and the process is complex.

SUMMARY OF THE INVENTION

The technology problem solved by the embodiment of the present invention is to provide a thin-film transistor array substrate and a manufacturing method for the same such that the number of masks required for manufacturing the thin-film transistor array substrate is reduced.

In order to solve the above technology problem, one aspect of the present invention provides a manufacturing method for a thin-film transistor, comprising: providing a base substrate; depositing a first metal layer on the base substrate, and patterning the first metal layer in order to form a gate electrode and a first storage electrode; depositing a gate insulation layer, wherein the gate insulation layer covers the gate electrode and the first storage electrode; depositing a metal oxide semiconductor layer, and patterning the metal oxide semiconductor layer to form a metal oxide active layer; depositing a second insulation layer, and patterning the second insulation layer to form an etching barrier layer; depositing a second metal layer, and patterning the second metal layer to form a source electrode, a drain electrode and a second storage electrode, wherein the first storage electrode and the second storage electrode are two electrodes of a storage capacitor; depositing a third insulation layer, and patterning the third insulation layer to form a passivation layer; and depositing a third metal layer, and patterning the third metal layer to form a pixel electrode.

Wherein the step of depositing a gate insulation layer includes a step of depositing the gate insulation layer in a high temperature condition.

Wherein the first storage electrode, the gate insulation layer and the second storage electrode commonly form the storage capacitor.

Wherein a portion of the etching barrier layer corresponding to the first storage electrode forms a storage through hole, and the storage through hole is also extended downward to a portion of the gate insulation layer.

Wherein a range of the high temperature condition is greater than 300° C.

Wherein a thickness range of the gate insulation layer is 1000 Å-5000 Å.

Wherein the step of depositing a second insulation layer includes a step of depositing the second insulation layer through a PECVD method under a low temperature condition.

Wherein a thickness of the second insulation layer is 200 Å-2000 Å.

The second aspect of the embodiment of the present invention provides a thin-film array substrate, comprising: a base substrate; a gate electrode formed on the base substrate; a first storage electrode formed on the base substrate; a gate insulation layer covering gate electrode and the first storage electrode; a metal oxide active layer formed on the gate insulation layer, and the metal oxide active layer is disposed corresponding to the metal oxide active layer; an etching barrier layer formed on the metal oxide active layer and the gate insulation layer, and a portion of the etching barrier layer corresponding to the first storage electrode is provided with a storage through hole; a source electrode and a drain electrode electrically connected to the metal oxide active layer through the etching barrier layer; a second storage electrode located in the storage through hole, wherein the first storage capacitor, the gate insulation layer and the second storage electrode form a storage capacitor; a passivation layer covers the etching barrier layer, the source electrode, the drain electrode and the second storage electrode; and a pixel electrode formed on the passivation layer, and the pixel electrode is electrically connected to the drain electrode.

The embodiment of the present invention has following beneficial effect: because the gate insulation layer is directly deposited, the gate insulation layer covers the gate electrode and the first storage electrode without using a mask to patterning the gate insulation layer. Accordingly, comparing to the conventional art, the number of the masks for manufacturing the thin-film transistor substrate is reduce from seven to six such that one mask is saved, cost is saved and process is reduced. Besides, in the present embodiment, because the storage capacitor includes at least a portion of the gate insulation layer, the gate insulation layer is denser so that the storage capacitor is not easily to be broken through.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Moreover, the terms "comprise," include," or any other variation thereof, are intended to cover a non-exclusive inclusion, such that a series of elements including the process, method, article or device that includes not only those elements but also other elements not expressly listed or further comprising such process, method, article or device inherent elements. Without more constraints, by the statement "comprises one . . . " element defined does not exclude the existence of additional identical elements in the process, method, article, or apparatus. In the specification, claims, and accompanying drawings of the present disclosure, the terms "first", "second", "third", and so on are intended to distinguish between similar objects but do not necessarily indicate a specific order or sequence.

The present invention provides with a manufacturing method for a thin-film transistor, with reference to FIG. 2-FIG. 4f, the method comprises:

S110: providing a base substrate 210;

In the present embodiment, the base substrate 210 can be a glass substrate or a transparent plastic substrate. The base substrate 210 can be flexible or no-flexible.

Figure 1:
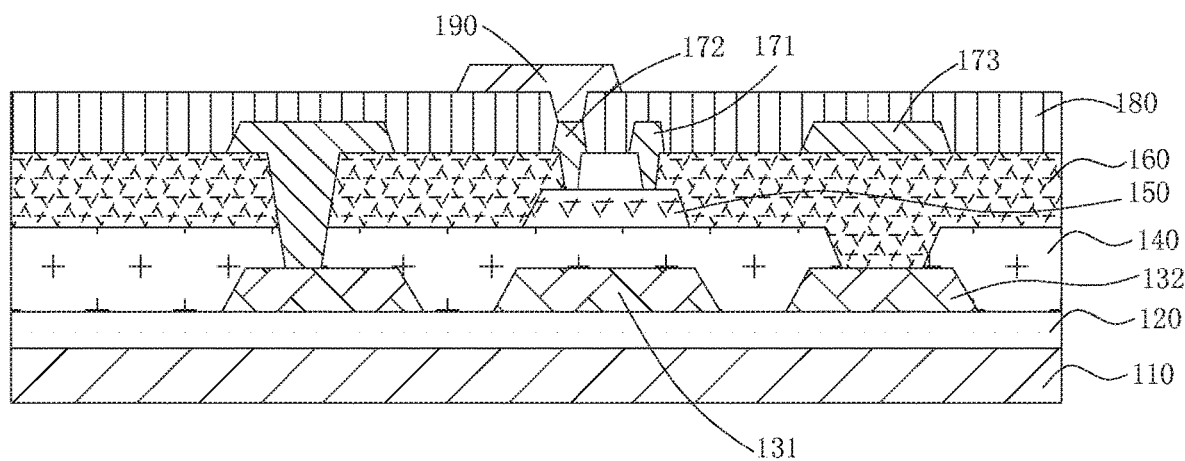
FIG. 1 is a schematic diagram of a thin-film transistor array substrate of conventional art.
Figure 2:
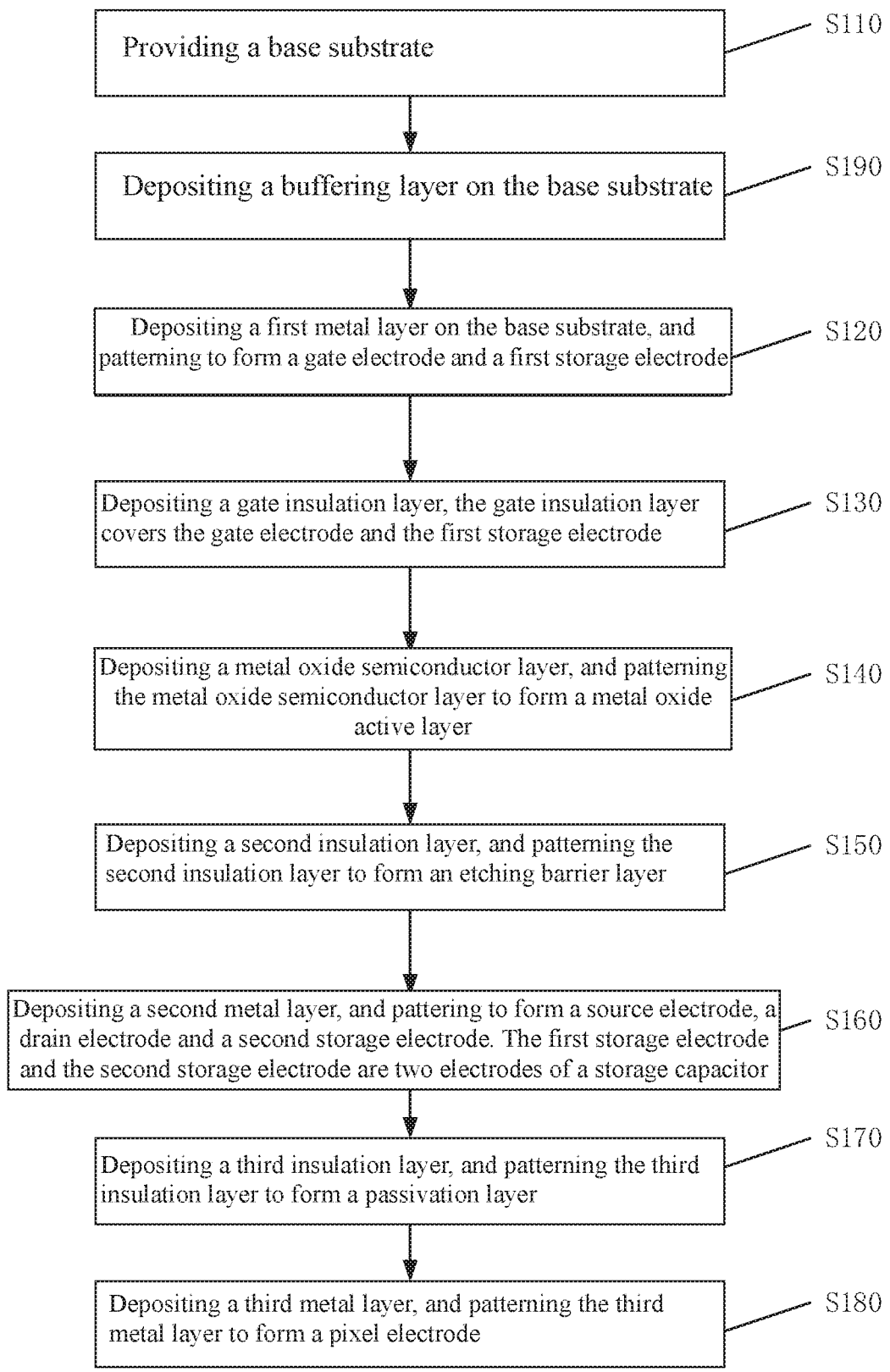
FIG. 2 is a flow chart of a manufacturing method for a thin-film transistor array substrate according to an embodiment of the present invention.
Figure 3A:
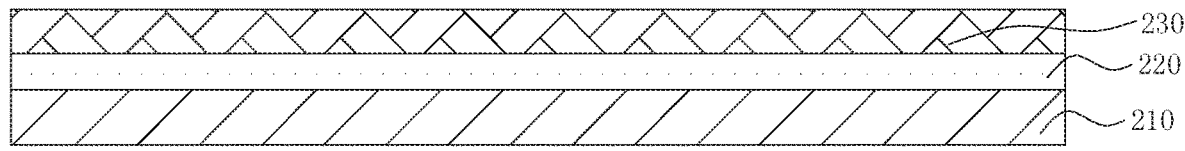
FIG. 3a-FIG. 3f is a schematic diagram of each film layer deposited on the base substrate of the thin-film transistor array substrate according to an embodiment of the present invention; and FIG. 4a-FIG. 4f is a schematic diagram of each film layer of the thin-film transistor array substrate after patterning according to an embodiment of the present invention.

S120: depositing a first metal layer 230 on the base substrate 210, and patterning the first metal layer 230 in order to form a gate electrode 331 and a first storage electrode 332;

In the present embodiment, with reference to FIG. 3a, depositing the first metal layer 230 on the base substrate 210. The material of the first metal layer 230 can be Mo, Al, Cu or Ti, or an alloy such as an alloy of Mo and Al. A thickness of the first metal layer 230 is 2000 Å (angstrom)~10000 Å such as 2000 Å, 4000 Å, 5000 Å, 6000 Å, 8000 Å or 10000 Å. After forming the first metal layer 230, with reference to FIG. 4a, through a mask for patterning the first metal layer 230 in order to form a gate electrode 331 and a first storage capacitor 332. The gate electrode 331 and the first storage capacitor 332 are disposed separately. Besides, in the present embodiment, scanning lines are formed on the base substrate 210. The scanning lines are electrically connected to a corresponding gate electrode 331.

Besides, in order to prevent impurities of the base substrate 210 from entering to the gate electrode 331 and the first storage electrode 332, in the present embodiment, before the step S120, the method further comprises:

S190: depositing a buffering layer 220 on the base substrate 210;

In the present embodiment, upper surface of entire base substrate 210 is deposited with the buffering layer 220. The material of the buffering layer 220 is SiO, SiN or a mixture of the above. The thickness of the buffering layer 220 is 500 Å~5000 Å such as 500 Å, 800 Å, 1000 Å, 2000 Å, 3000 Å, 4000 Å, 5000 Å. Of course, before depositing the buffering layer 220, cleaning the base substrate 210 is required. Besides, in another embodiment of the present invention, among the base substrate, the gate electrode and the first storage electrode, the buffering layer is not required. That is, the gate electrode and the first storage electrode are directly formed on the base substrate.

S130: depositing a gate insulation layer 240, the gate insulation layer 240 covers the gate electrode 331 and the first storage electrode 332;

In the present embodiment, a layer of the gate insulation layer 240 is disposed on the gate electrode 331, the first storage electrode 332, the scanning lines and the buffering layer 220. Here, the gate insulation 240 is an entire layer. In the present embodiment, the gate insulation layer 240 is deposited in a high temperature condition. Specifically, the high temperature for depositing the gate insulation layer 240 is greater than 300° C. such as 310° C., 350° C., 400° C., 450° C., 500° C., 550° C. or 600° C. Because the temperature for depositing the gate insulation layer is higher so that the gate insulation layer is denser, which is not easily to be broken through. In the present embodiment, the gate insulation layer is thicker, and a thickness range of the gate insulation layer 240 is 1000 Å-5000 Å such as 1000 Å, 2000 Å, 3000 Å, 4000 Å or 5000 Å. In the present embodiment, because the gate insulation layer is an entire layer, no mask is required to perform a patterning. Besides, the material of the gate insulation layer 240 is SiOx or SiNx.

Figure 3B:
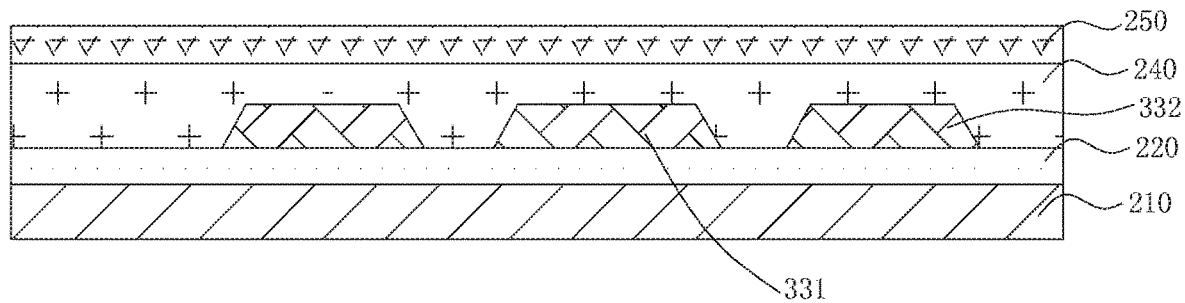

S140: depositing a metal oxide semiconductor layer 250, and patterning the metal oxide semiconductor layer 250 to form a metal oxide active layer 350;

In the present embodiment, with reference to FIG. 3b, depositing a metal oxide semiconductor layer 250 in the gate insulation layer 240. The material of the metal oxide semiconductor layer 250 is IGZO (indium gallium zinc oxide), IZTO (Indium Zinc Tin Oxide), and IGZTO (Indium Gallium Zinc Tin Oxide). The thickness of the metal oxide semiconductor layer 250 is 100 Å-1000 Å such as 100 Å, 200 Å, 300 Å, 400 Å, 500 Å, 600 Å, 700 Å, 800 Å, 900 Å, 1000 Å. After depositing the metal oxide semiconductor layer 250, through a mask to perform exposure, development, etching in order to form the metal oxide active layer 350, with reference to FIG. 4b, the metal oxide active layer 350 is located above the gate electrode 331.

Figure 3C:
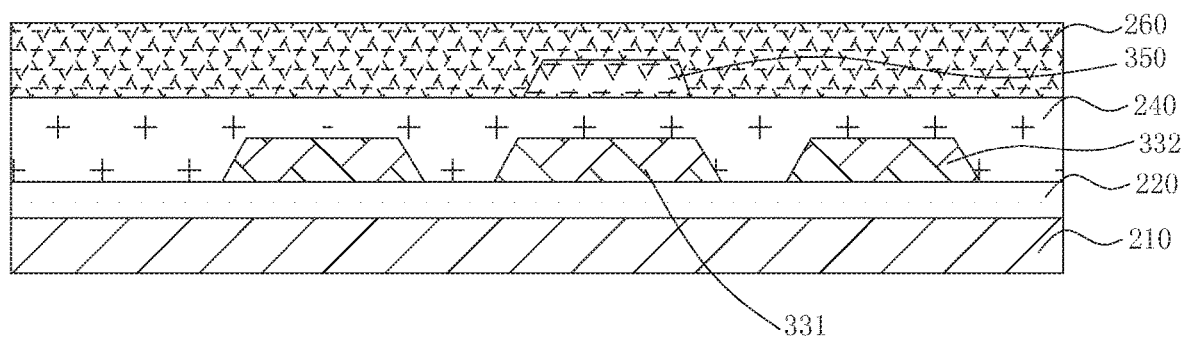

S150: depositing a second insulation layer 260, and patterning the second insulation layer 260 to form an etching barrier layer 360;

In the present embodiment, with reference to FIG. 3c, depositing the second insulation layer 260 on the metal oxide active layer 350 and the gate insulation layer 204. Because below the second insulation layer 260, the metal oxide active layer 350 is existed, and the metal oxide active layer 350 cannot sustain a higher temperature so that the second insulation layer 260 is deposited in a low temperature condition. Specifically, in a low temperature condition, through PECVD (Plasma Enhanced Chemical Vapor Deposition) for depositing. Because under a low temperature condition, the low temperature will not damage the metal oxide active layer 350. In the present embodiment, the low temperature is less than 300° C. such as 250° C., 200° C., 150° C. or 100° C. so that the second insulation layer 260 is looser comparing to the gate insulation layer 240. In the present embodiment, the material of the second insulation layer 260 is SiOx, SiNx or a multi-layered structure.

Besides, because the second insulation layer 260 is formed through PECVD method, when deposition, a plasma of the insulation layer will hit the metal oxide active layer 350. If the thickness of the second insulation layer 260 is thicker, the time that the plasma hit the metal oxide active layer 350 is too long such that the metal oxide active layer 350 is easily to be damaged. In order to avoid the above situation, in the present embodiment, the thickness of the second insulation layer 260 is 200 Å-2000 Å such as 200 Å, 300 Å, 400 Å, 500 Å, 600 Å, 700 Å, 800 Å, 900 Å, 1000 Å or 2000 Å. In the present embodiment, the second insulation layer 260 is not too thick, the metal oxide active layer 350 is not easily to be damaged in the process, and the second insulation layer 260 cannot be too thin, or the electric insulation performance is poor.

Figure 4A:
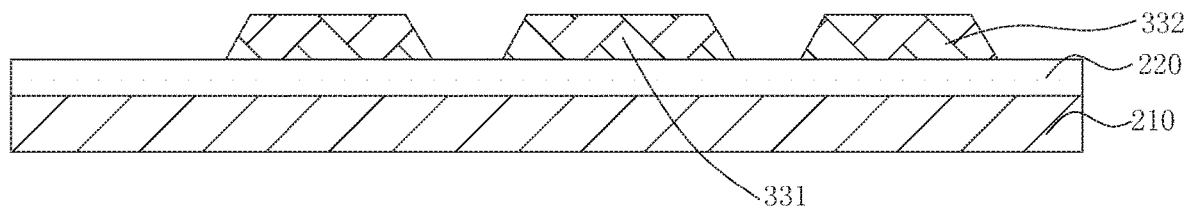
Figure 4B:
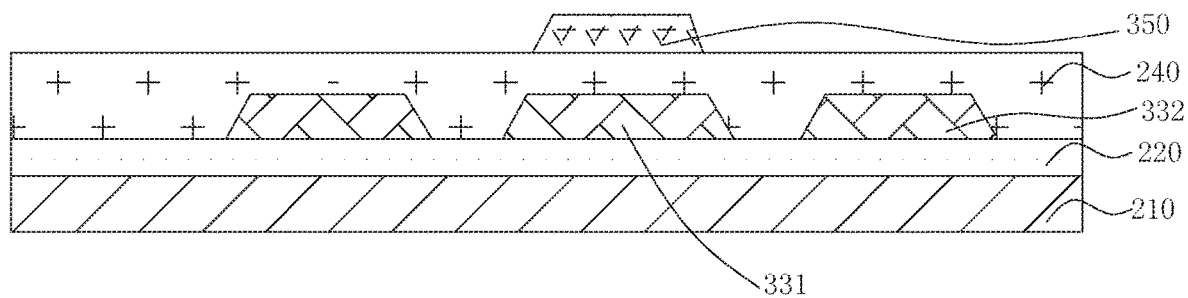
Figure 4C:
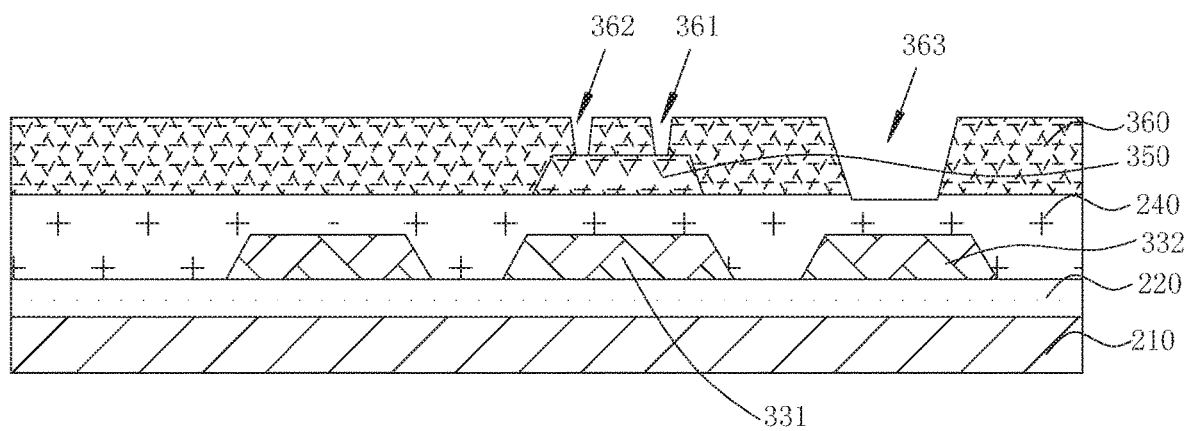

In the present embodiment, after depositing the second insulation layer 260, with reference to FIG. 4c, through a mask to patterning the second insulation layer 260. Specifically, through a mask to perform exposure, development, etching in order to form the etching barrier layer 360. In the present embodiment, the etching process is a dry etching. In the present embodiment, after forming the etching barrier layer 360, at least three holes are formed on the etching barrier layer 360, specifically, a source through hole 361, a drain through hole 362 and a storage through hole 363 are formed. Wherein, the source through hole 361 and the drain through hole 362 are located at the metal oxide active layer 350 and located at two sides of the metal oxide active layer 350. The storage through hole 363 is disposed corresponding to the first storage electrode 332. In the process of forming the above three through holes, when etching the second insulation layer 260, the drying etching can control different etching depths at different regions. When etching to the metal oxide active layer 350, the etching is stopped to form the source through hole 361 and the drain through hole 362.

Meanwhile, above the first storage electrode 332, the dry etching continues to etch the material of the second insulation layer 260 above the first storage electrode 332, and etches out a portion of the gate insulation layer 240. That is, the storage through hole is extended downward to the gate insulation layer 240, that is, performing an over etching above the first storage electrode 332. Besides, in another embodiment of the present invention, the etching of the second insulation layer above the first storage electrode can be designed according to the storage capacitor, but at least includes a portion of the gate insulation layer. In the present embodiment, the thickness of the gate insulation layer 240 above the first storage electrode 332 is less than or equal to the thickness of the second insulation layer 260.

S160: depositing a second metal layer 270, and pattering the second metal layer 270 to form a source electrode 371, a drain electrode 372 and a second storage electrode 373. The first storage electrode 332 and the second storage electrode 373 are two electrodes of a storage capacitor.

Figure 3D:
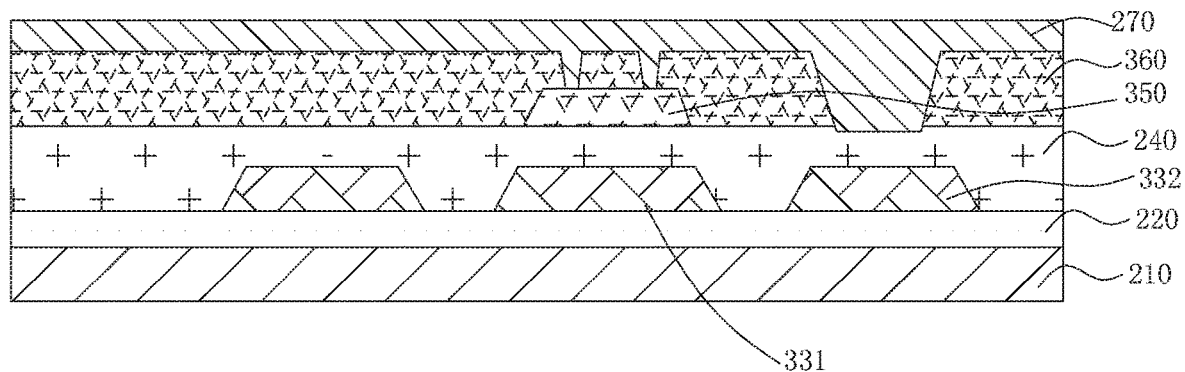

In the present embodiment, with reference to FIG. 3d, depositing a second metal layer 270 on the etching barrier layer 360. The material of the second metal layer 270 a metal of Mo, Al, Cu and Ti or a metal alloy. The thickness of the second metal layer 270 is 2000 Å-10000 Å such as 2000 Å, 3000 Å, 4000 Å, 5000 Å, 6000 Å, 7000 Å, 8000 Å, 9000 Å or 10000 Å. At this time, the second metal layer 270 enters the source through hole 361, the drain through hole 362 and the storage through hole 363.

Figure 4D:
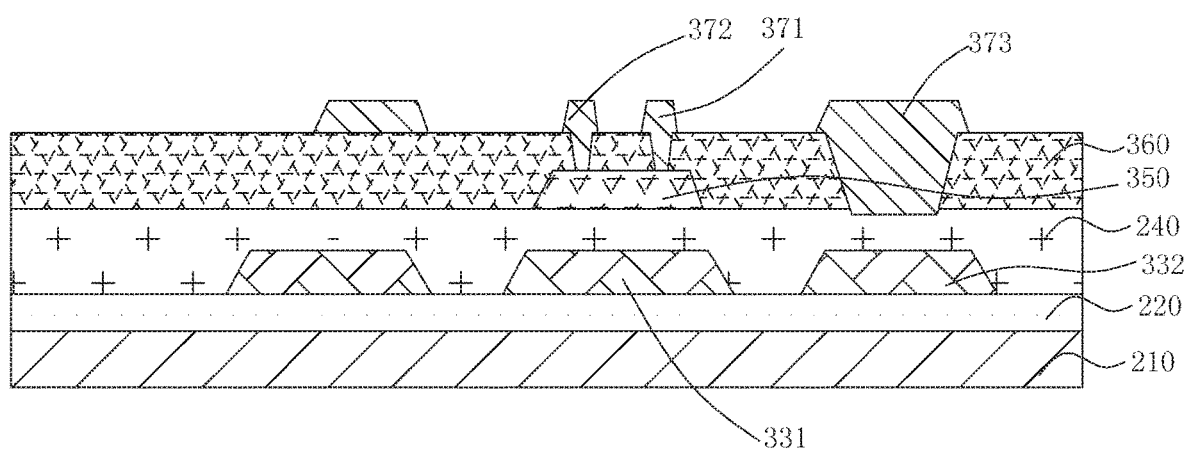

Then, through a mask to patterning the second metal layer 270, with reference to FIG. 4d in order to form a source electrode 371, a drain electrode 372 and a second storage electrode 373. The source electrode 371 is connected to a side of the metal oxide active layer 350, and the drain electrode 372 is connected to the other side of the metal oxide active layer 350. The second storage electrode 373 is disposed corresponding to the first storage electrode 332. The gate insulation layer 240 is disposed between the second storage electrode 373 and the first storage electrode 332. Accordingly, the first storage electrode 332, the gate insulation layer 240 and the second storage electrode 373 form a storage capacitor. In the present embodiment, because the gate insulation layer 240 disposed between the first storage electrode 332 and the second storage electrode 373 is formed by a high temperature so that the gate insulation layer 240 is denser, and the storage capacitor is not easily to be broken through.

Besides, in the present embodiment, through a mask to patterning the second metal layer 270. The etching barrier layer 360 is further provided with data lines, and the data lines are electrically connected to the source electrode 371. When the gate electrode 331 is at a high voltage level, the signals on the data lines are transmitted to the drain electrode 372 through the source electrode 371 and the metal oxide active layer 350.

Figure 3E:
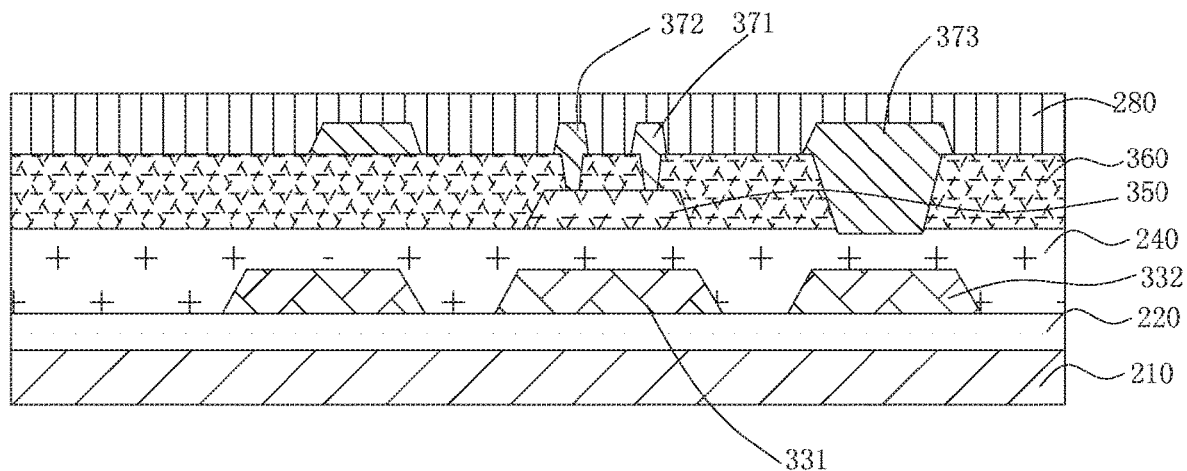

S170: depositing a third insulation layer 280, and patterning the third insulation layer 280 to form a passivation layer 380;

In the present embodiment, with reference to FIG. 3e, the third insulation layer 280 is deposited on the data line, the source electrodes 371, the drain electrodes 372, the second storage electrode 373 and the etching barrier layer 360. The thickness of the third insulation layer 280 is thicker in order to reach planarization effect. In the present embodiment, the thickness of the third insulation layer 280 is 1000 Å-5000 Å such as 1000 Å, 2000 Å, 3000 Å, 4000 Å or 5000 Å. In the present embodiment, the third insulation layer 280 is a SiOx layer, a SiNx layer or a multi-layered structure.

Figure 4E:
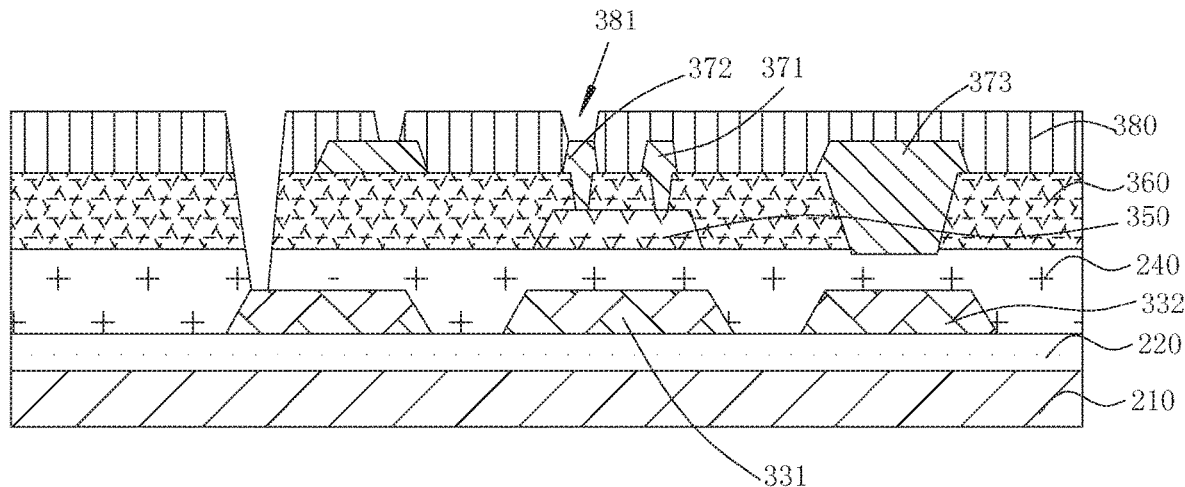

After forming the third insulation layer 280, through a mask to patterning the third insulation layer 280 to form a passivation layer 380 as shown in FIG. 4e. Specifically, forming a pixel vias 381 on the passivation layer 380, and the pixel vias 381 is located above the drain electrode 372. The pixel vias 381 is used for connecting the drain electrode 372 and a pixel electrode 390 formed later. Besides, in the present embodiment, other vias are formed on the passivation layer for transmitting electric signals.

S180: depositing a third metal layer 290, and patterning the third metal layer 290 to form a pixel electrode 390.

Figure 3F:
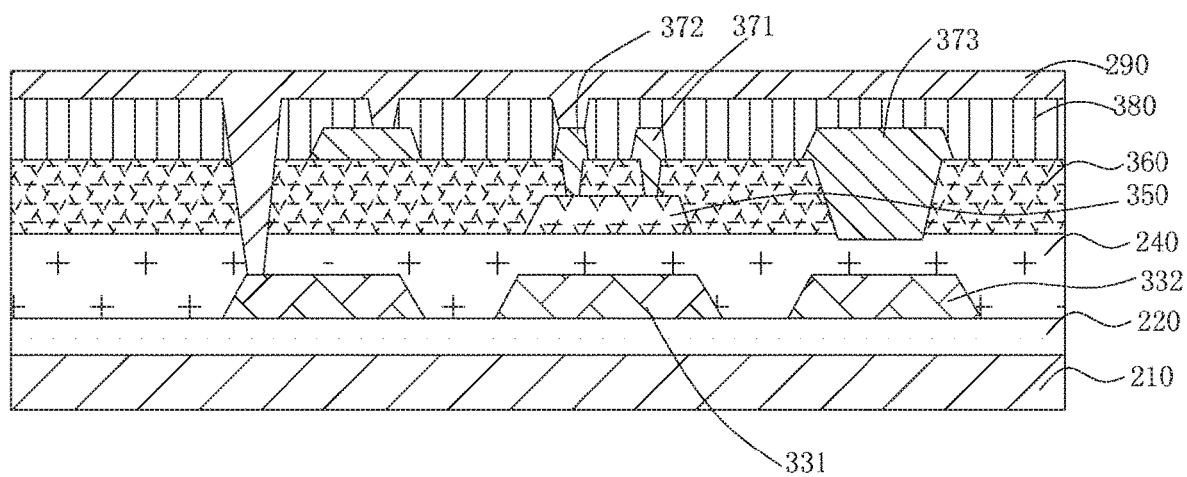
Figure 4F:
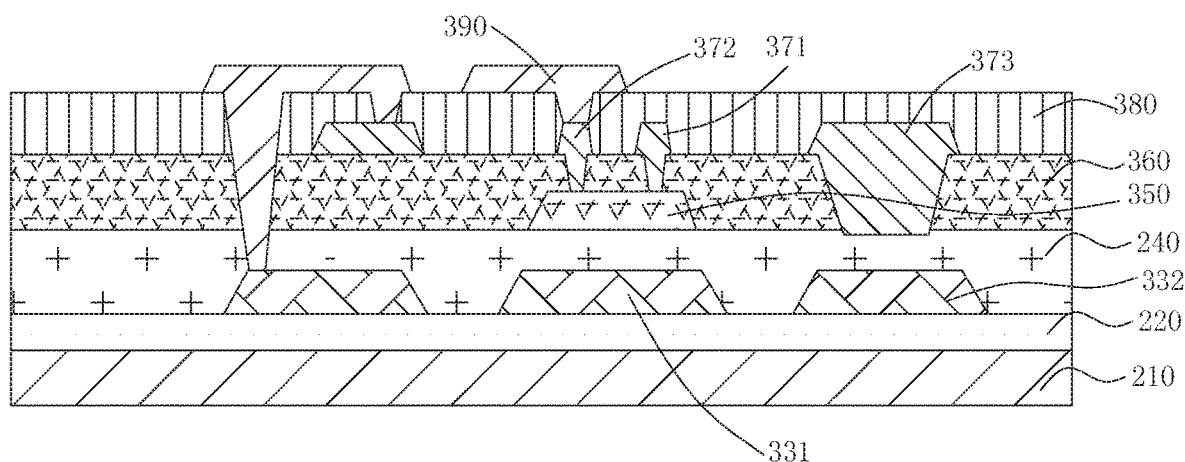

In the present embodiment, with reference to FIG. 3f, depositing a third metal layer 290 on the passivation layer 380, and the third metal layer 290 enters the pixel vias 381 and other vias. The material of the third metal layer 290 is ITO. Through a mask to patterning the third metal layer 290 as shown in FIG. 4f to realize the pixel electrode 390 and other traces. In the present embodiment, the pixel electrode 390 is electrically connected to the drain electrode 372.

In the present embodiment, because the gate insulation layer 240 is directly deposited, the gate insulation layer 240 covers the gate electrode 331 and the first storage electrode 332 without using a mask to patterning the gate insulation layer 240. Accordingly, comparing to the conventional art, the number of the masks for manufacturing the thin-film transistor substrate is reduce from seven to six such that one mask is saved, cost is saved and process is reduced. Besides, in the present embodiment, because the storage capacitor includes at least a portion of the gate insulation layer 240, the gate insulation layer is denser so that the storage capacitor is not easily to be broken through.

The embodiment of the present invention also provides a thin-film transistor array substrate, with reference to FIG. 4f, the array substrate includes a base substrate 210, a gate electrode 331, a first storage electrode 332, a gate insulation layer 240, a metal oxide active layer 350, an etching barrier layer 360, a source electrode 371, a drain electrode 372, a second storage electrode 373, a passivation layer 380 and a pixel electrode 390.

In the present embodiment, the base substrate 210 can be a glass substrate or a transparent plastic substrate. The base substrate 210 can be flexible or no-flexible.

In the present embodiment, the gate electrode 331 and the first storage electrode 332 are indirectly formed in the base substrate 210. The gate electrode 331 and the storage electrode 332 are patterning through a same metal layer. The material of the gate electrode 331 and the first storage electrode 332 is a metal of Mo, Al, Cu and Ti or a metal alloy. In the present embodiment, among the gate electrode 331, the first storage electrode 332 and the base substrate 210 is provided with a buffering layer 220. Of course, in another embodiment, the buffering layer 220 is not required. Besides, in the present embodiment, in the present embodiment, scanning lines are formed on the base substrate 210. The scanning lines are electrically connected to a corresponding gate electrode 331.

In the present embodiment, a layer of the gate insulation layer 240 is disposed on the gate electrode 331, the first storage electrode 332, the scanning lines and the buffering layer 220. Here, the gate insulation 240 is an entire layer. In the present embodiment, the gate insulation layer 240 is deposited in a high temperature condition. Specifically, the high temperature for depositing the gate insulation layer 240 is greater than 300° C. such as 310° C., 350° C., 400° C., 450° C., 500° C., 550° C. or 600° C. Because the temperature for depositing the gate insulation layer is higher so that the gate insulation layer is denser, which is not easily to be broken through. In the present embodiment, the gate insulation layer is thicker, and a thickness range of the gate insulation layer 240 is 1000 Å-5000 Å such as 1000 Å, 2000 Å, 3000 Å, 4000 Å or 5000 Å. In the present embodiment, because the gate insulation layer is an entire layer, no mask is required to perform a patterning. Besides, the material of the gate insulation layer 240 is SiOx or SiNx.

In the present embodiment, the metal oxide active layer 350 is located above the gate electrode 331. The material of the metal oxide semiconductor layer 250 is IGZO (indium gallium zinc oxide), IZTO (Indium Zinc Tin Oxide), and IGZTO (Indium Gallium Zinc Tin Oxide). The thickness of the metal oxide semiconductor layer 250 is 100 Å-1000 Å such as 100 Å, 200 Å, 300 Å, 400 Å, 500 Å, 600 Å, 700 Å, 800 Å, 900 Å, 1000 Å. Because the active layer utilizes a metal oxide semiconductor material, the thin-film transistor including the metal oxide active layer 350 has a higher electron mobility, smaller size, which can increase the aperture ratio of the array substrate and easily to realize high definition.

In the present embodiment, the etching barrier layer 360 is formed on the metal oxide active layer 350 and the gate insulation layer 240. The etching barrier layer 360 is patterning through a low temperature deposition. Because of low temperature deposition, the etching barrier layer 360 is looser comparing to the gate insulation layer 240. In the present embodiment, the material of the etching barrier layer 360 is SiOx, SiNx or a multi-layered structure. A thickness of the etching barrier layer 360 is 200-2000 Å.

In the present embodiment, at least three holes are formed on the etching barrier layer 360, specifically, a source through hole 361, a drain through hole 362 and a storage through hole 363 are formed (with reference to FIG. 4c). Wherein, the source through hole 361 and the drain through hole 362 are located at the metal oxide active layer 350 and located at two sides of the metal oxide active layer 350. The storage through hole 363 is disposed corresponding to the first storage electrode 332.

In the present embodiment, the source electrode 371, the drain electrode 372 and the second storage electrode 373 are formed on the etching barrier layer 360. The source electrode 371, the drain electrode 372 and the second storage electrode 373 are formed by a same layer of metal pattern. The material of the source electrode 371, the drain electrode 372 and the second storage electrode 373 is Mo, Al, Cu or Ti, or an alloy. The thickness of the source electrode 371, the drain electrode 372 and the second storage electrode 373 is 2000 Å-10000 Å. The source electrode 371 is connected to a side of the metal oxide active layer 350, and the drain electrode 372 is connected to the other side of the metal oxide active layer 350. The second storage electrode 373 is disposed corresponding to the first storage electrode 332. The gate insulation layer 240 is disposed between the second storage electrode 373 and the first storage electrode 332. Accordingly, the first storage electrode 332, the gate insulation layer 240 and the second storage electrode 373 form a storage capacitor.

In the present embodiment, the passivation layer 380 is formed on the source electrode 371, the drain electrode 372, the second storage electrode 373 and the etching barrier layer 360. The passivation layer 380 is a SiOx layer, a SiNx layer or a multi-layered structure. In the present embodiment, a pixel vias 381 is formed on the passivation layer (with reference to FIG. 4e). the pixel vias 381 is located above the drain electrode 372. The pixel vias 381 is used for connecting the drain electrode 372 and a pixel electrode 390 formed later. Besides, in the present embodiment, other vias are formed on the passivation layer for transmitting electric signals.

In the present embodiment, the pixel electrode 390 is formed on the passivation layer 380, and the pixel electrode 390 enters the pixel vias 381. The material of the pixel electrode 390 is ITO. The pixel electrode 390 is electrically connected to the drain electrode 372.

The embodiments in the specification are described in a progressive manner. For same or similar parts in the embodiments, reference may be made to each other. Each embodiment focuses on differences from other embodiments. In particular, the system or system embodiment is basically similar to the method embodiment and therefore is described briefly. For the relevant part, reference may be made to the part of the description of the method embodiment.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for a thin-film transistor array substrate, comprising:

providing a base substrate;

depositing a first metal layer on the base substrate, and patterning the first metal layer in order to form a gate electrode and a first storage electrode;

depositing a gate insulation layer, wherein the gate insulation layer covers the gate electrode and the first storage electrode;

depositing a metal oxide semiconductor layer, and patterning the metal oxide semiconductor layer to form a metal oxide active layer;

depositing a second insulation layer, and patterning the second insulation layer to form an etching barrier layer; wherein patterning the second insulation layer is implemented by a process of dry etching, and a portion of the second insulation layer corresponding to the metal oxide semiconductor layer is etched to form a source through hole and a drain through hole; wherein a portion of the second insulation layer above the first storage electrode is etched to form a storage through hole and a portion of the gate insulation layer is etched for performing an over etching above the first storage electrode so that the storage through hole is extended downward to the portion of the gate insulation layer;

depositing a second metal layer, and pattering the second metal layer to form a source electrode in the source through hole, a drain electrode in the drain through hole and a second storage electrode, wherein the second storage electrode is formed in the storage through hole extended downward to the portion of the gate insulation layer, and wherein the first storage electrode and the second storage electrode are two electrodes of a storage capacitor, in which the gate insulation layer is disposed between the second storage electrode and the first storage electrode;

depositing a third insulation layer, and patterning the third insulation layer to form a passivation layer; and depositing a third metal layer, and patterning the third metal layer to form a pixel electrode.

2. The manufacturing method for a thin-film transistor array substrate according to claim 1, wherein the step of depositing a gate insulation layer includes a step of depositing the gate insulation layer in a high temperature condition.

3. The manufacturing method for a thin-film transistor array substrate according to claim 2, wherein the first storage electrode, the gate insulation layer and the second storage electrode commonly form the storage capacitor.

4. The manufacturing method for a thin-film transistor array substrate according to claim 2, wherein a range of the high temperature condition is greater than 300° C.

5. The manufacturing method for a thin-film transistor array substrate according to claim 2, wherein a thickness range of the gate insulation layer is 1000 Å-5000 Å.

6. The manufacturing method for a thin-film transistor array substrate according to claim 1, wherein the step of depositing a second insulation layer includes a step of depositing the second insulation layer through a PECVD method under a low temperature condition.

7. The manufacturing method for a thin-film transistor array substrate according to claim 6, wherein a thickness of the second insulation layer is 200 Å-2000 Å.

* * * * *